(12) United States Patent
Mo et al.

(10) Patent No.: US 10,446,206 B2
(45) Date of Patent: Oct. 15, 2019

(54) VERTICAL MEMORY CELLS AND MEMORY DEVICES USING THE SAME

(71) Applicant: Taiwan Semiconductor Manufacturing Co., Ltd., Hsin-Chu (TW)

(72) Inventors: Chun-Chieh Mo, Kaohsiung (TW); Shih-Chi Kuo, Yangmei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/965,872

(22) Filed: Apr. 28, 2018

(65) Prior Publication Data

US 2019/0164585 A1   May 30, 2019

Related U.S. Application Data

(60) Provisional application No. 62/591,456, filed on Nov. 28, 2017.

(51) Int. Cl.
| | |
|---|---|
| G11C 11/16 | (2006.01) |
| H01L 27/22 | (2006.01) |
| H01L 43/08 | (2006.01) |
| H01L 43/12 | (2006.01) |
| H01L 43/10 | (2006.01) |
| H01L 43/02 | (2006.01) |
| G11C 8/14 | (2006.01) |
| G11C 7/18 | (2006.01) |

(52) U.S. Cl.
CPC ............. *G11C 11/161* (2013.01); *G11C 7/18* (2013.01); *G11C 8/14* (2013.01); *H01L 27/222* (2013.01); *H01L 43/02* (2013.01); *H01L 43/08* (2013.01); *H01L 43/10* (2013.01); *H01L 43/12* (2013.01)

(58) Field of Classification Search
CPC . G11C 11/14–16; G11C 11/161; H01L 43/02; H01L 43/08; H01L 43/10; H01L 27/222; H01L 27/224; H01L 27/226; H01L 27/228
See application file for complete search history.

(56) References Cited

U.S. PATENT DOCUMENTS

| | | | | |
|---|---|---|---|---|
| 7,705,340 B2* | 4/2010 | Lin | ......................... | H01L 43/08 257/2 |
| 7,781,231 B2* | 8/2010 | Li | ......................... | B82Y 25/00 257/295 |
| 9,601,544 B2* | 3/2017 | Min | ......................... | H01L 43/08 |
| 2006/0033133 A1* | 2/2006 | Liu | ......................... | H01L 27/228 257/295 |
| 2019/0036013 A1* | 1/2019 | Mo | ......................... | H01L 43/08 |

* cited by examiner

*Primary Examiner* — Allison Bernstein
(74) *Attorney, Agent, or Firm* — Duane Morris LLP

(57) ABSTRACT

Vertical memory cells and memory devices using the same are disclosed. In one example, a memory cell formed on a backend layer over a substrate is disclosed. The memory cell includes: a first electrode, a second electrode and a magnetic tunnel junction. The first electrode has sidewalls and a bottom surface disposed over the backend layer. The second electrode has sidewalls and a bottom surface in contact with the backend layer. The magnetic tunnel junction is formed between the first electrode and the second electrode. The magnetic tunnel junction is coupled to a sidewall of the first electrode and coupled to a sidewall of the second electrode.

20 Claims, 19 Drawing Sheets

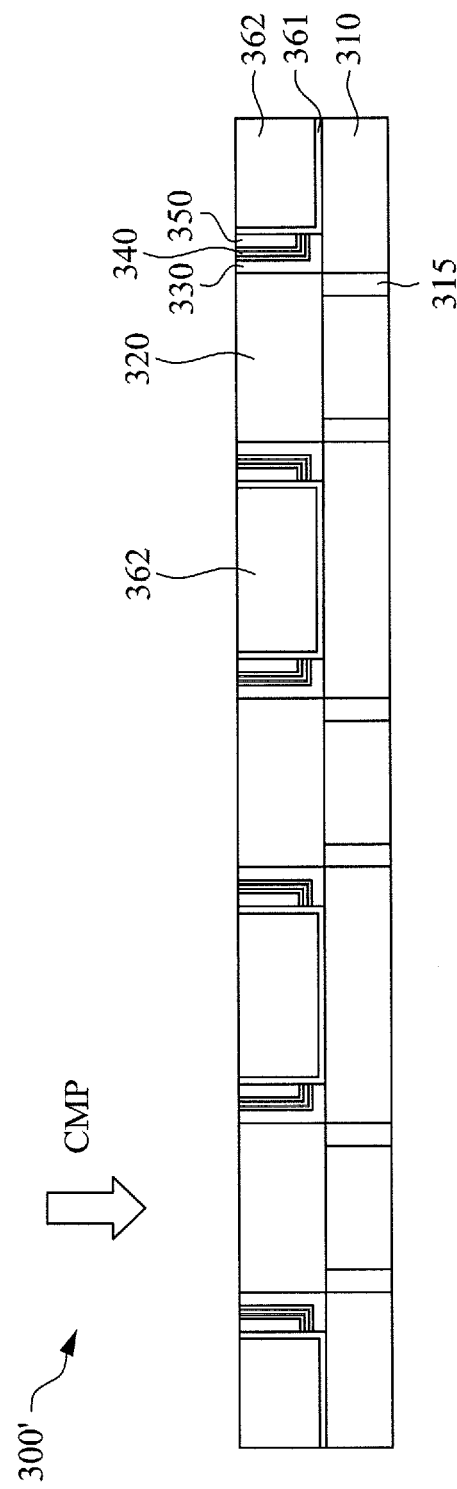

VERTICAL MEMORY CELLS AND MEMORY DEVICES USING THE SAME

CROSS-REFERENCE TO RELATED APPLICATION

The present application claims priority to U.S. Provisional Patent Application No. 62/591,456, filed on Nov. 28, 2017, which is incorporated by reference herein in its entirety.

BACKGROUND

Semiconductor memories are widely used in integrated circuits for electronic applications, including radios, televisions, cell phones, and personal computing devices, etc. One type of semiconductor memory device involves spin electronics, which combines semiconductor technology and magnetic materials and devices. The spins of electrons, through their magnetic moments, rather than the charge of the electrons, are used to indicate a bit. One such spin electronic device is a magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell. Compared to current volatile memory, MRAM typically has similar performance and density, but lower power consumption.

As integrated circuits (IC) including such MRAM cells become more popular, it is desirable to maximize the number of MRAM cells within a given area of IC to maximize storage capacity. An existing MRAM device includes MRAM cells arranged in an array on a backend layer. Each individual MRAM cell in the existing MRAM device includes an MTJ arranged in parallel to the backend layer. Packing more and more MRAM cells in a given area may encounter a limit. For example, decreasing the size of the MRAM cells would allow for higher storage density, but at some critical size the magnetization of the magnetic memory cell starts flipping randomly its direction due to thermal activation which marks superparamagnetic state of the system, which sets a superparamagnetic limit on the current storage density and capacity. Thus, existing MRAM cells and devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIGS. 3A, 3B, 3C, 3D, 3E, 3F, 3G, 3H, 3I, 3J, 3K, 3L, 3M, 3N, 3O, 3P, 3Q and 3R illustrate cross-sectional views of an exemplary memory device during various fabrication stages, in accordance with some embodiments of the present disclosure.

DETAILED DESCRIPTION OF EXEMPLARY EMBODIMENTS

Figure 1:
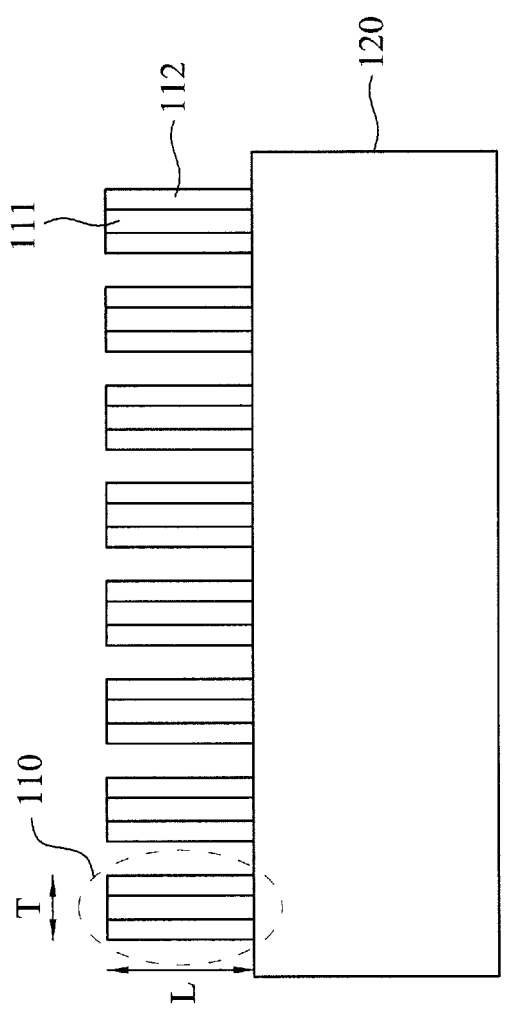
FIG. 1 illustrates a cross-sectional view of exemplary memory cells having a vertical structure on a unit area, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

As integrated circuits (IC) including magnetoresistive random access memory (MRAM) cells become more popular, it is desirable to maximize storage density, i.e. the number of MRAM cells within a given area of IC, to maximize storage capacity. Each individual MRAM cell in an existing MRAM device is arranged in parallel to a backend layer over the substrate. Packing more and more such MRAM cells in a given area may encounter a limit. For example, decreasing the size of the MRAM cells would allow for higher storage density, but at a certain critical size the magnetization of the magnetic memory cell starts flipping randomly its direction due to thermal activation which marks superparamagnetic state of the system, which sets a superparamagnetic limit on the storage density and capacity of existing MRAM devices.

The present disclosure provides various embodiments of a novel MRAM device and methods to form the same. In some embodiments, the disclosed MRAM device includes a plurality of MRAM cells on a backend layer. Each of the MRAM cells includes a vertically extending magnetic tunnel junction formed between two electrodes. Forming a vertical magnetic tunnel junction or vertical MRAM cell that is perpendicular to a top surface of the backend layer allows the MRAM device to increase its storage density, i.e. increasing the number of MRAM cells packed in a unit area, without suffering the superparamagnetic limit.

The present disclosure is applicable to any magnetic storage including an MRAM device. The disclosed vertical memory cell structure can greatly improve storage capacity of an MRAM device. The novel vertical cell structure is easy to approach and detect. In the present disclosure, the terms "cell," "memory cell," and "MRAM cell" may be interchangeably used.

FIG. 1 illustrates a cross-sectional view of exemplary memory cells having a vertical structure on a unit area, in accordance with some embodiments of the present disclosure. As shown in FIG. 1, there are multiple memory cells 110 packed on a unit area 120 over a substrate. For example, the memory cells 110 are MRAM cells in an MRAM device. Each of the memory cells 110 has a vertical structure that is perpendicular to a top surface of the substrate. Each memory cell 110 has a length L and a thickness T that may be smaller than the length L. In various embodiments, the ratio T/L between the thickness T and the length L may be in the range of 0.02-1. In one embodiment, the ration T/L is about 0.7. In one example, the thickness T is 1000 Angstroms and the length L is 1450 Angstroms. Each memory cell includes two electrodes 112 and a magnetic tunnel junction (MTJ) 111 formed between the two electrodes 112.

Figure 2:
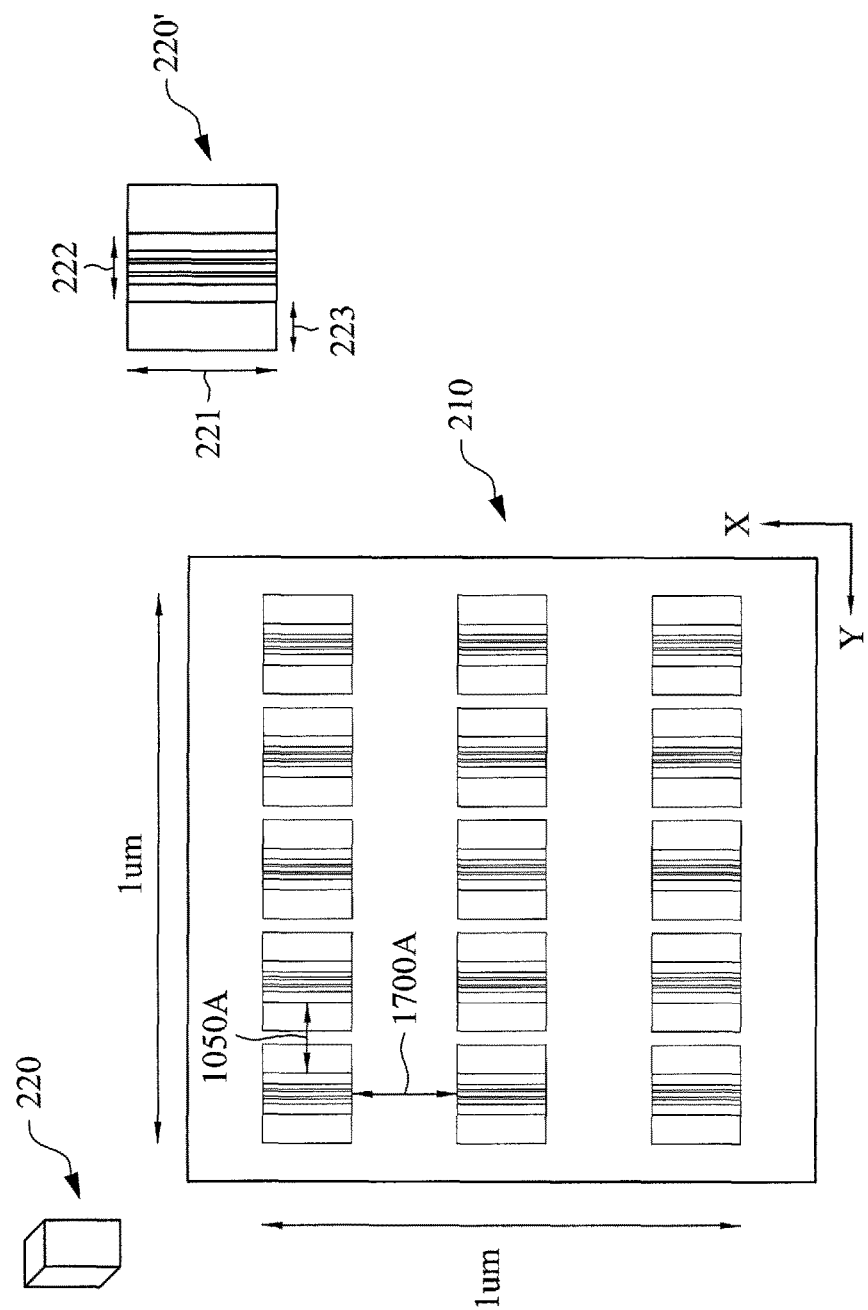
FIG. 2 illustrates a top view of an exemplary memory cell array including vertical memory cells on a unit area, in accordance with some embodiments of the present disclosure.

FIG. 2 illustrates a top view of an exemplary memory cell array including vertical memory cells on a unit area, in accordance with some embodiments of the present disclosure. As shown in FIG. 2, the memory cell array 210 in this example is a square array on a backend layer over the substrate and includes a plurality of memory cells 220 arranged along an X direction and a Y direction. Each memory cell 220 may be an MRAM cell that has a cuboid shape over the substrate. FIG. 2 also shows a top view 220' of the memory cell. As shown in the top view 220', each memory cell includes a sandwich structure including an MTJ between two electrodes. In this example, the sandwich structure has a length 221 of about 1450 Angstroms along the X direction, and a thickness 222 of about 1000 Angstroms along the Y direction. Each memory cell 220, 220' is electrically coupled to two conductive lines each having a thickness 223 of 500 Angstroms.

As shown in FIG. 2, a memory cell 220 is about 1050 Angstroms away from a neighbor memory cell along the Y direction; and is about 1700 Angstroms away from a neighbor memory cell along the X direction. In one embodiment, when a superparamagnetic limit of the MTJ in each memory cell 220 limits the size or length of the MTJ to be 1450 Angstroms along the X direction, the disclosed vertical structure of the MTJ can further decrease the thickness of the memory cell along the Y direction to be 1000 Angstroms. As such, compared to a horizontal or lateral MRAM structure, the vertical MRAM structure in this embodiment can increase the storage density of an MRAM device by about 25%.

Figure 3A:
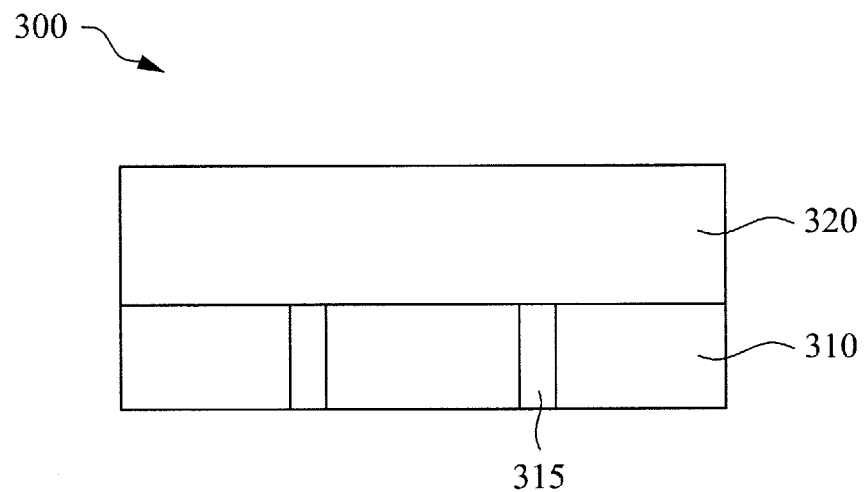

FIGS. 3A, 3B, 3C, 3D, 3E, 3F, 3G, 3H, 3I, 3J, 3K, 3L, 3M, 3N, 3O, 3P, 3Q and 3R illustrate cross-sectional views of an exemplary memory device during various fabrication stages, in accordance with some embodiments of the present disclosure. In some embodiments, the memory device may be an MRAM device. The MRAM device may be included in a microprocessor, memory cell, and/or other integrated circuit (IC). In addition, FIGS. 3A through 3R are simplified for a better understanding of the concepts of the present disclosure. For example, although the figures illustrate the MRAM device, it is understood the IC, in which the MRAM device is formed, may include a number of other devices comprising resistors, capacitors, inductors, fuses, etc., which are not shown in FIGS. 3A through 3R, for purposes of clarity of illustration.

FIG. 3A is a cross-sectional view of the MRAM device 300 including a backend layer 310 with a conductive material 315, which is provided, at one of the various stages of fabrication, according to some embodiments of the present disclosure. The MRAM device 300 in FIG. 3A further includes an inter-metal dielectric (IMD) layer 320 formed on the backend layer 310. Each conductive material 315 serves as a via in the backend layer 310. Although there are only two conductive materials 315 shown in FIG. 3A, it can be understood that FIG. 3A focuses on an illustration of a portion of the MRAM device, and the other portions on the same backend layer 310 may be repetitive of what is shown in FIG. 3A.

In one embodiment, the backend layer 310 may be a top layer of an MRAM array formed under the backend layer 310. In that situation, the conductive materials 315 are multiple conductive lines in the backend layer 310 that electrically connect the MRAM cells in the MRAM array under the backend layer 310. In another embodiment, there is no MRAM array under the backend layer 310 such that the backend layer 310 is the bottom layer of the MRAM device and includes no conductive material 315.

In some embodiments, the backend layer 310 has a dielectric material formed over various device features (e.g., a source, drain, or gate electrode of a transistor). Such a dielectric material backend layer 310 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In such an embodiment where the backend layer 310 includes a dielectric material, the conductive material 315 may be a via structure (i.e., a vertical conductive structure) formed within the backend layer 310. In some embodiments, the conductive material 315 may be formed of a metal material, e.g., copper (Cu), aluminum (Al), tungsten (W), etc.

Figure 3B:
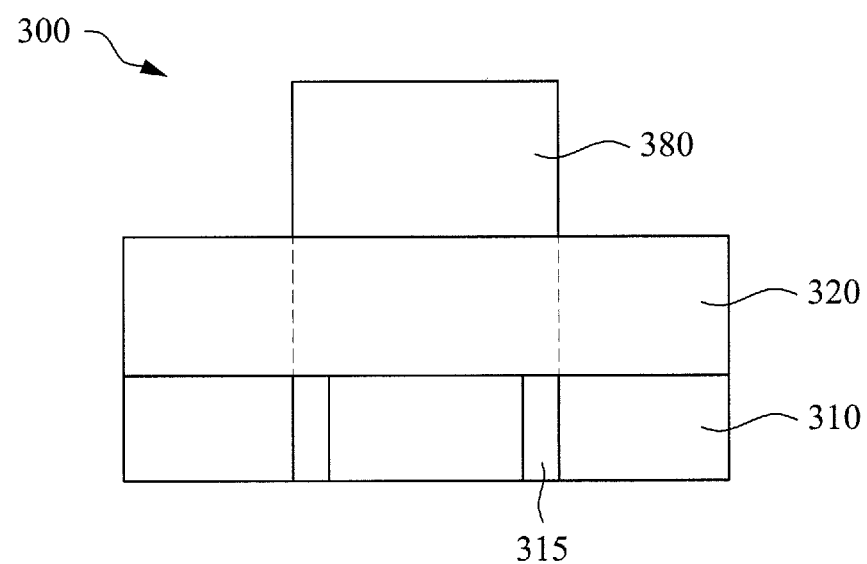

FIG. 3B is a cross-sectional view of the MRAM device 300 including a photoresist 380, which is formed on the backend layer 310 at one of the various stages of fabrication, according to some embodiments of the present disclosure. As shown in FIG. 3B, the photoresist 380 has a profile that covers the two adjacent conductive materials 315 and the backend layer portion between the two adjacent conductive materials 315. The sidewalls of the photoresist 380 align with the outside walls of the two adjacent conductive materials 315. In one embodiment, the photoresist 380 may be formed by a deposition process to form a photoresist layer over the IMD layer 320, and a lithography process to define the profile of the photoresist layer that includes the photoresist 380. The photoresist 380 may include a light-sensitive material.

Figure 3C:
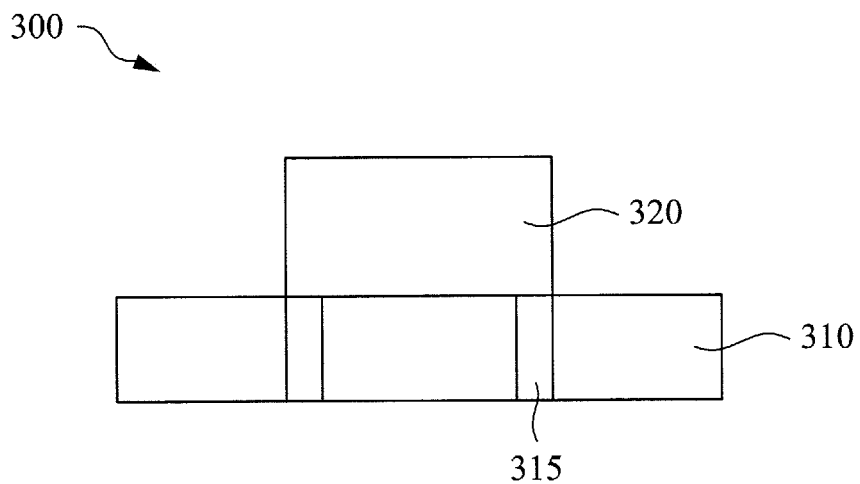

FIG. 3C is a cross-sectional view of the MRAM device 300 in which the IMD 320 is patterned, at one of the various stages of fabrication, according to some embodiments of the present disclosure. According to some embodiments, the IMD 320 is patterned to remove portions that are not covered by the photoresist 380 as shown in FIG. 3B. As such, the IMD 320 becomes a stack in FIG. 3C, covering the two adjacent conductive materials 315 and the backend layer portion between the two adjacent conductive materials 315. The sidewalls of the IMD stack 320 align with the outside walls of the two adjacent conductive materials 315.

In some embodiments, the patterning process performed on the IMD 320 may include: based on a profile of the photoresist 380 defined by a lithography process, a dry/wet etching process to etch portions of the IMD 320 that are not covered by the defined profile of the lithography process layer, a cleaning process, and a soft/hard baking process to form the patterned IMD stack.

Figure 3D:
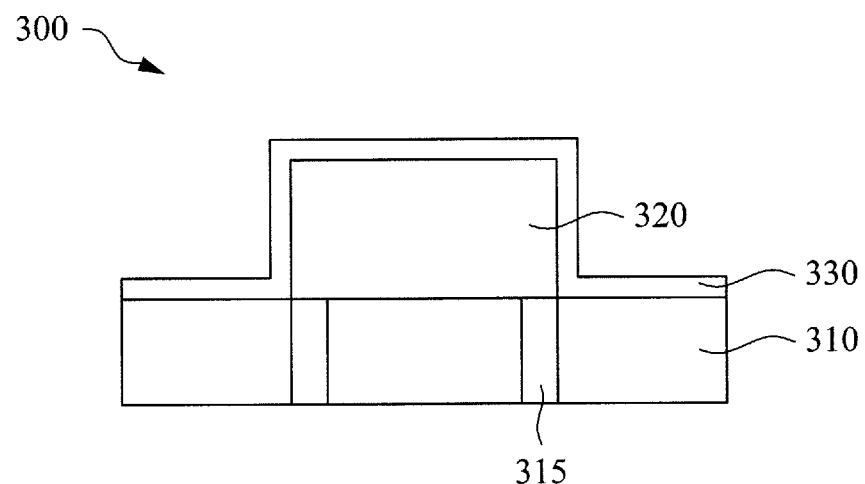

FIG. 3D is a cross-sectional view of the MRAM device 300 including a first electrode layer 330, formed over the IMD stack 320 and the backend layer 310, at one of the various stages of fabrication, according to some embodiments of the present disclosure. According to some embodiments, the first electrode layer 330 may be formed by depositing a metal material, e.g. tantalum nitride (TaN). Due to the stack shape of the IMD stack 320, the first electrode layer 330 has two vertical portions along the two sidewalls of the IMD stack 320 respectively, and horizontal portions on the IMD stack 320 and on the backend layer 310.

Figure 3E:
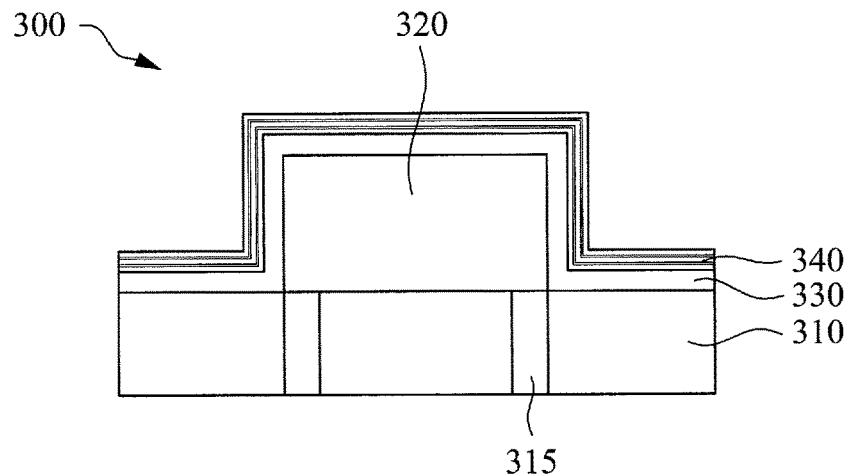

FIG. 3E is a cross-sectional view of the MRAM device 300 including an MTJ layer 340, formed over the first electrode layer 330, at one of the various stages of fabrication, according to some embodiments of the present disclosure. According to some embodiments, the MTJ layer 340 may be formed by depositing a lower contact layer, a lower ferromagnetic layer, an insulator layer, an upper ferromagnetic layer, and an upper contact layer, in respective order. The lower ferromagnetic layer and upper ferromagnetic layer may include a ferromagnetic material, e.g. iron, nickel, cobalt or their alloys. The insulator layer may include a material like magnesium oxide (MgO). Due to the stack shape of the IMD stack 320, the MTJ layer 340 has two vertical portions along the two sidewalls of the IMD stack 320 respectively, and horizontal portions above the IMD stack 320 and above the backend layer 310.

In one embodiment, the MTJ layer 340 may be formed by depositing a fixed layer, a barrier layer, and a free layer, in respective order. The fixed layer is a synthetic anti-ferromagnetic (SAF) layer that may further include a bottom layer, a metal layer over the bottom layer, and a top pinned layer over the metal layer. The bottom layer may include ferromagnetic materials like CoFeB, NiFe, CoFe, Fe, etc. The metal layer may include metal materials like Ru, Cu, Ta, etc. The top pinned layer may include ferromagnetic materials like CoFeB, NiFe, CoFe, Fe, etc. The barrier layer is an insulation layer that includes materials like $Al_2O_3$, MgO, etc. The free layer includes ferromagnetic materials like CoFeB, NiFe, CoFe, Fe, etc. In one example, the MTJ layer 340 may have a total thickness between 100 Angstroms and 500 Angstroms.

Figure 3F:
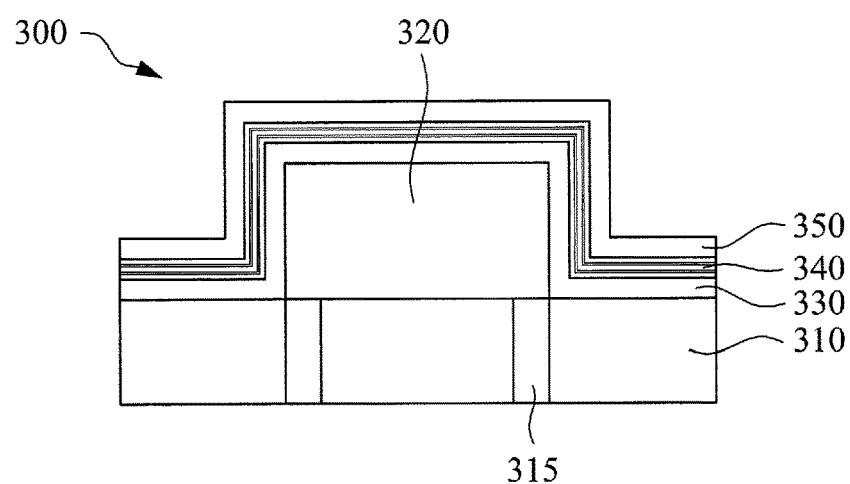

FIG. 3F is a cross-sectional view of the MRAM device 300 including a second electrode layer 350, formed over the MTJ layer 340, at one of the various stages of fabrication, according to some embodiments of the present disclosure. According to some embodiments, the second electrode layer 350 may be formed by depositing a metal material, e.g. tantalum nitride (TaN). Due to the stack shape of the IMD stack 320, the second electrode layer 350 has two vertical portions along the two sidewalls of the IMD stack 320 respectively, and horizontal portions above the IMD stack 320 and above the backend layer 310. As such, the first electrode layer 330, the MTJ layer 340, and the second electrode layer 350 form a sandwich structure (hereinafter "memory cell sandwich") over the IMD stack 320 and the backend layer 310. The memory cell sandwich includes two vertical portions along the two sidewalls of the IMD stack 320 respectively, and horizontal portions above the IMD stack 320 and above the backend layer 310.

Figure 3G:
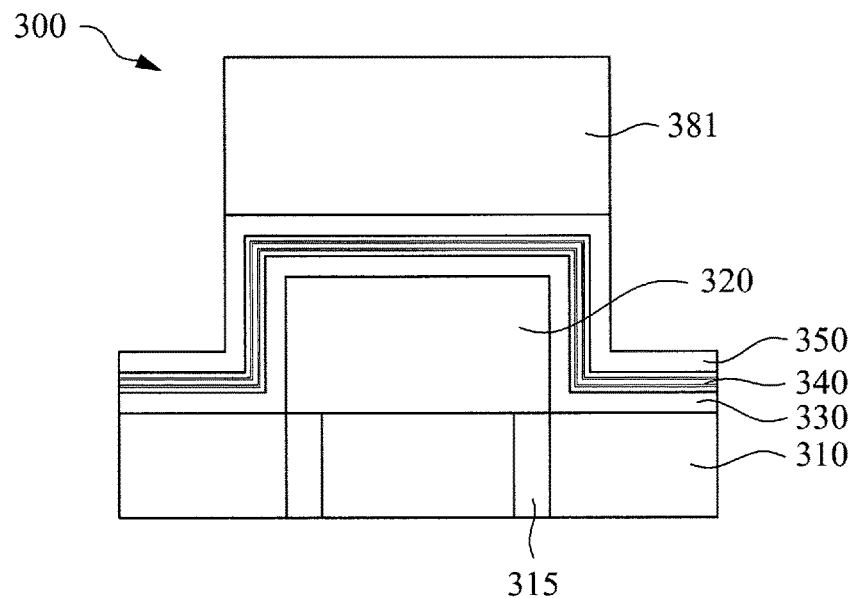

FIG. 3G is a cross-sectional view of the MRAM device 300 including a photoresist 381, which is formed on the horizontal portion of the memory cell sandwich above the IMD stack 320, at one of the various stages of fabrication, according to some embodiments of the present disclosure. As shown in FIG. 3G, the photoresist 381 has a profile that covers the two vertical portions of the memory cell sandwich and the IMD stack 320 between the two vertical portions of the memory cell sandwich. The sidewalls of the photoresist 381 align with the outside walls of the two vertical portions of the memory cell sandwich, i.e. aligning with the outside walls of the two vertical portions of the second electrode layer 350. In one embodiment, the photoresist 381 may be formed by a deposition process to form a photoresist layer over the IMD stack 320, and a lithography process to define the profile of the photoresist layer that includes the photoresist 381. The photoresist 381 may include a light-sensitive material same as or different from the photoresist 380.

Figure 3H:
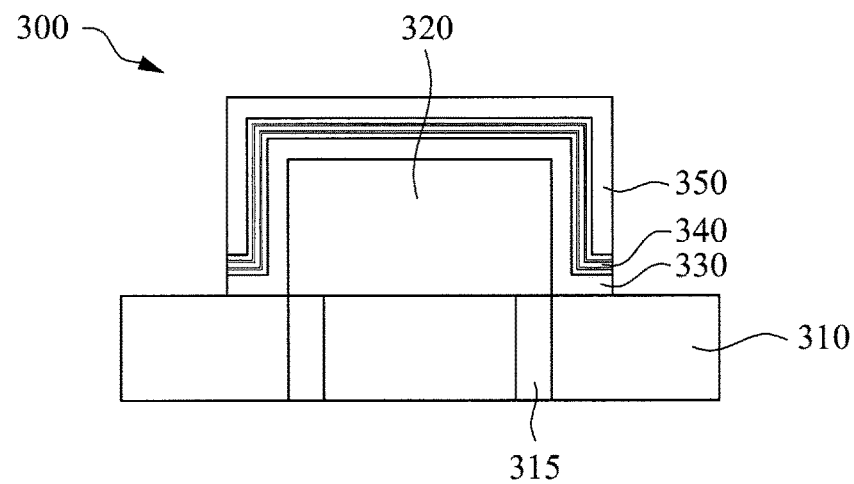

FIG. 3H is a cross-sectional view of the MRAM device 300 in which the memory cell sandwich including the first electrode layer 330, the MTJ layer 340 and the second electrode layer 350 is patterned, at one of the various stages of fabrication, according to some embodiments of the present disclosure. According to some embodiments, the memory cell sandwich is patterned to remove horizontal portions above the backend layer 310 that are not covered by the photoresist 381 as shown in FIG. 3G. As such, the remaining portions of the memory cell sandwich form a stack cap covering the IMD stack 320. The stack cap includes a horizontal portion above the IMD stack 320 and two vertical portions adjoining the two sidewalls of the IMD stack 320 respectively.

In some embodiments, the patterning process performed on the memory cell sandwich may include: based on a profile of the photoresist 381 defined by a lithography process, a dry/wet etching process to etch portions of the memory cell sandwich that are not covered by the defined profile of the lithography process layer, a cleaning process, and a soft/hard baking process to form the patterned memory cell sandwich.

Figure 3I:
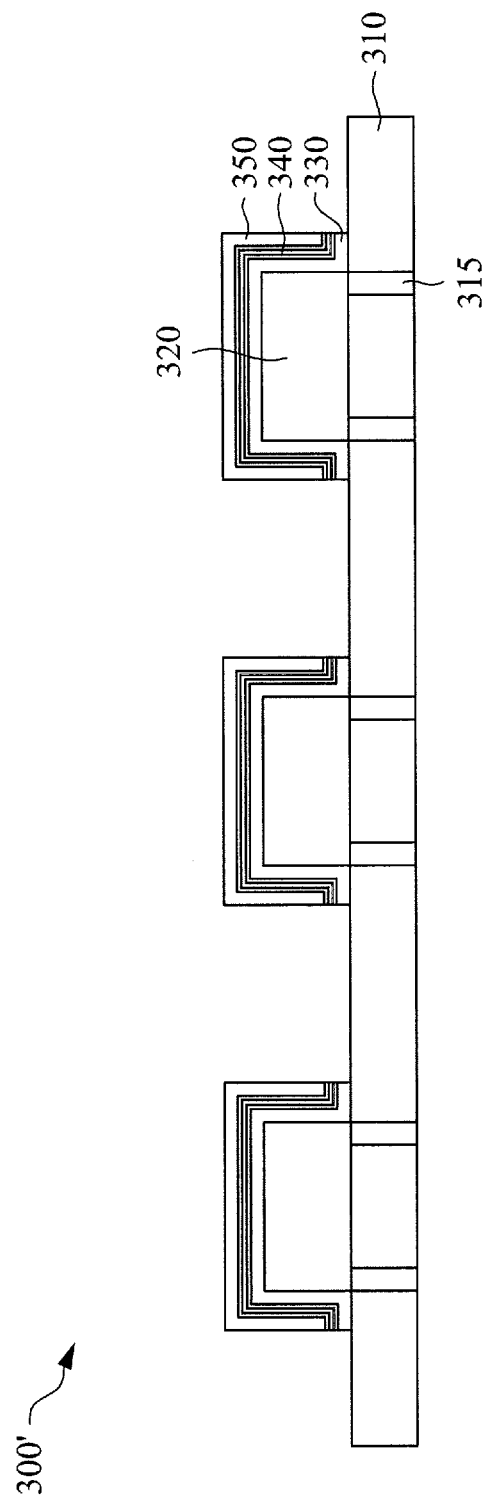

FIG. 3I is a cross-sectional view of the MRAM device 300', which shows a larger portion of the MRAM device compared to the portion of the MRAM device shown in FIG. 3H, in which the memory cell sandwiches each including the first electrode layer 330, the MTJ layer 340 and the second electrode layer 350 are patterned, at one of the various stages of fabrication, according to some embodiments of the present disclosure. According to some embodiments, the distance between two adjacent IMD stacks 320 is controlled to maximize the storage density of the MRAM device 300'.

Figure 3J:
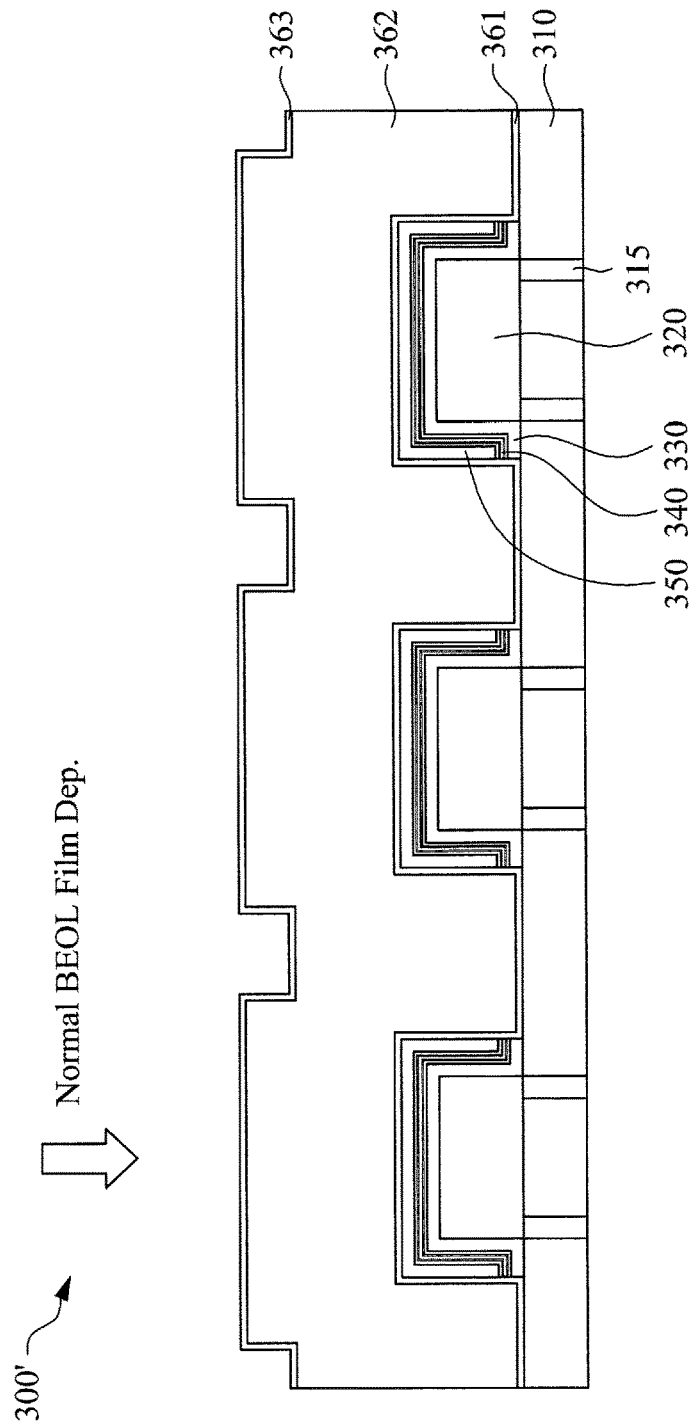

FIG. 3J is a cross-sectional view of the MRAM device 300' including a protective layer 361, an additional IMD layer 362, and an optional coating layer 363 which are formed on the patterned memory cell sandwich and the backend layer 310, at one of the various stages of fabrication, according to some embodiments of the present disclosure. According to some embodiments, the protective layer 361 may be formed by depositing a silicon carbide (SiC) for protection of the electrodes. Due to the stack shape of the IMD stacks 320, the protective layer 361 has two vertical portions along the two sidewalls of each IMD stack 320 respectively, and horizontal portions on the IMD stacks 320 and on the backend layer 310. According to some embodiments, the additional IMD layer 362 may be formed by depositing a dielectric material that is same as or different from the dielectric material in the IMD stacks 320. The additional IMD layer 362 may be used for electrical isolation between adjacent memory cells. According to some embodiments, the optional coating layer 363 may be formed by depositing an anti-reflective coating (ARC) material. In one embodiment, each of these depositions may be a normal back end-of-line (BEOL) film deposition. The coating layer 363 is optional and it will be polished as shown in FIG. 3K.

FIG. 3K is a cross-sectional view of the MRAM device 300' in which the top portions of all layers including the stack caps (i.e. the memory cell sandwiches 330, 340, 350) above the backend layer 310 are removed, at one of the various stages of fabrication, according to some embodiments of the present disclosure. According to some embodiments, the top portions of all layers above the backend layer 310 are removed by a chemical mechanical planarization (CMP) polishing process. Specifically, the ARC layer 363, the top portion of the additional IMD layer 362, the horizontal portions of the protective layer 361 on the IMD stacks 320, the horizontal portions of the patterned memory cell sandwiches 330, 340, 350, on the IMD stacks 320, and optionally some top portions of the IMD stacks 320, are all removed e.g. by the CMP polishing. After the CMP polishing process, a top surface of all layers above the backend layer 310 is forming. As shown in FIG. 3K, after the CMP polishing process, each memory cell sandwich extends vertically, or along a direction perpendicular to an upper surface of the backend layer 310. Each memory cell sandwich includes two vertical electrodes and a vertical MTJ between and coupled to the two vertical electrodes. Each memory cell sandwich has two sidewalls, where one sidewall is coupled to a sidewall of an adjacent IMD stack 320 and the other sidewall is coupled to an adjacent vertical portion of the protective layer 361.

Figure 3L:
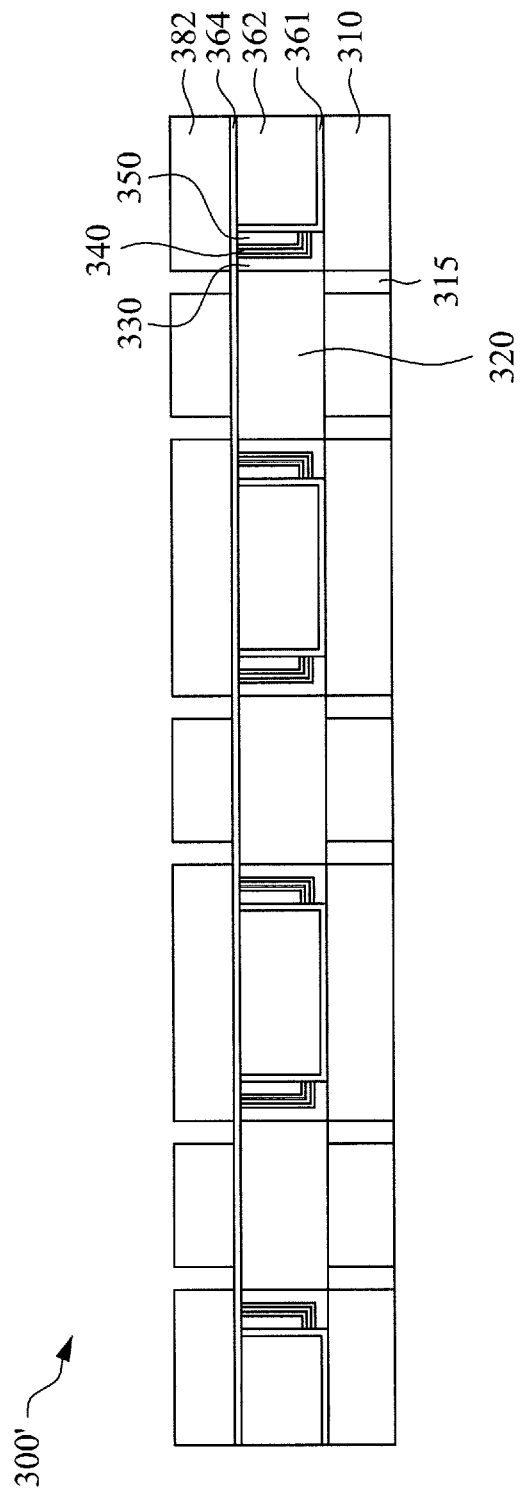

FIG. 3L is a cross-sectional view of the MRAM device 300' including another additional coating layer 364 which is formed on the top surface of all layers above the backend layer 310 as shown in FIG. 3K, and a patterned photoresist layer 382 which is formed on the coating layer 364, at one of the various stages of fabrication, according to some embodiments of the present disclosure. According to some embodiments, the coating layer 364 may be formed by depositing an ARC material that is same as or different from the coating layer 363.

As shown in FIG. 3L, the patterned photoresist layer 382 has a profile that covers the backend layer 310 except the conductive materials 315 in the backend layer 310. In one embodiment, the photoresist layer 382 may be formed by a deposition process to form a photoresist layer over the coating layer 364, and a lithography process to define the profile of the photoresist layer 382. The photoresist layer 382 may include a light-sensitive material that is same as or different from the photoresist 380 and/or the photoresist 381. As shown in FIG. 3L, the defined profile of the photoresist layer 382 includes uncovered portions aligning with the conductive materials 315 in the backend layer 310.

As discussed before, the sidewalls of each IMD stack 320 align with the outside walls of the two adjacent conductive materials 315 under the IMD stack 320. As such, one side of each uncovered portion of the patterned photoresist layer 382 aligns with a sidewall of a corresponding IMD stack 320 and hence aligns with a sidewall of a vertical portion of a corresponding memory cell sandwich, i.e. aligning with a vertical portion of the first electrode layer 330 of a corresponding memory cell sandwich.

Figure 3M:
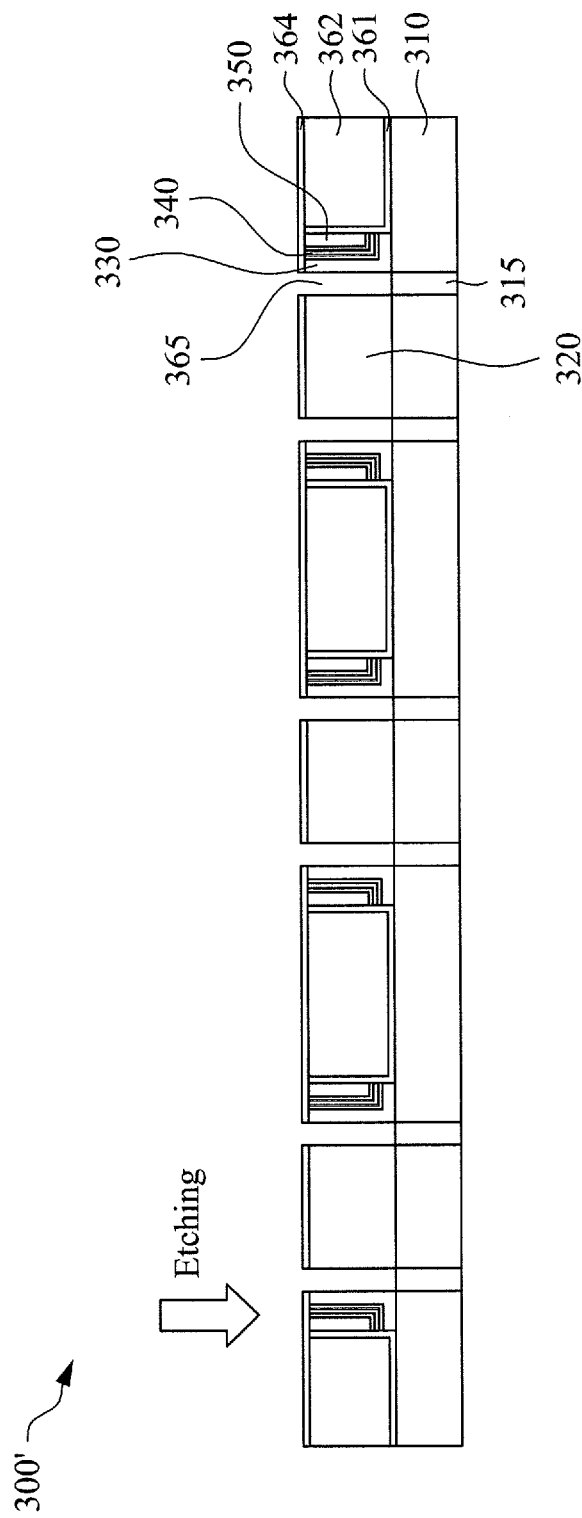

FIG. 3M is a cross-sectional view of the MRAM device 300' in which the IMD stacks 320 are patterned, at one of the various stages of fabrication, according to some embodiments of the present disclosure. According to some embodiments, each IMD stack 320 is patterned to remove two portions above the two corresponding conductive materials 315 under the IMD stack 320, i.e. the two portions of the IMD stack 320 that are not covered by the photoresist layer 382 as shown in FIG. 3L.

In some embodiments, the patterning process performed on the IMD stacks 320 may include: based on a profile of the photoresist layer 382 defined by a lithography process, a dry/wet etching process to etch portions of each IMD stack 320 that are not covered by the defined profile of the photoresist layer 382, a cleaning process, and a soft/hard baking process to form each patterned IMD stack 320.

As shown in FIG. 3M, each patterned IMD stack 320 is surrounded by two openings 365, each of which is above a corresponding conductive material 315 and adjoins a vertical portion of the first electrode layer 330 of a corresponding memory cell sandwich. In one example, the etching process performed on the IMD stacks 320 can be controlled, e.g. by controlling the etching time, to make each opening 365 have a proper depth such that a corresponding conductive material 315 in the backend layer 310 is exposed through the opening 365.

Figure 3N:
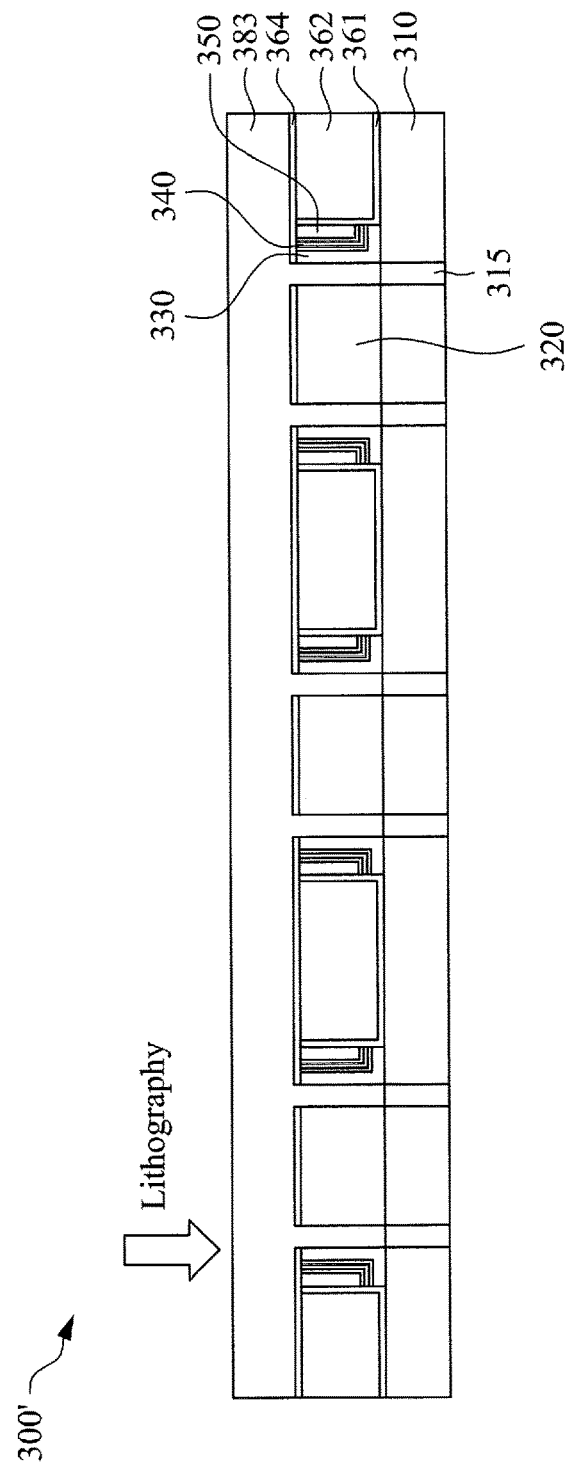

FIG. 3N is a cross-sectional view of the MRAM device 300' including a photoresist layer 383 which is formed on the coating layer 364 and the exposed conductive materials 315 in the backend layer 310, at one of the various stages of fabrication, according to some embodiments of the present disclosure. According to some embodiments, the photoresist layer 383 may include a light-sensitive material that is same as or different from the photoresist 380, the photoresist 381, and/or the photoresist layer 382. In one embodiment, the photoresist layer 383 may be formed by a deposition process to form a photoresist layer over the coating layer 364 and the exposed conductive materials 315 in the backend layer 310, and a lithography process to define a profile of the photoresist layer 383.

Figure 3O:
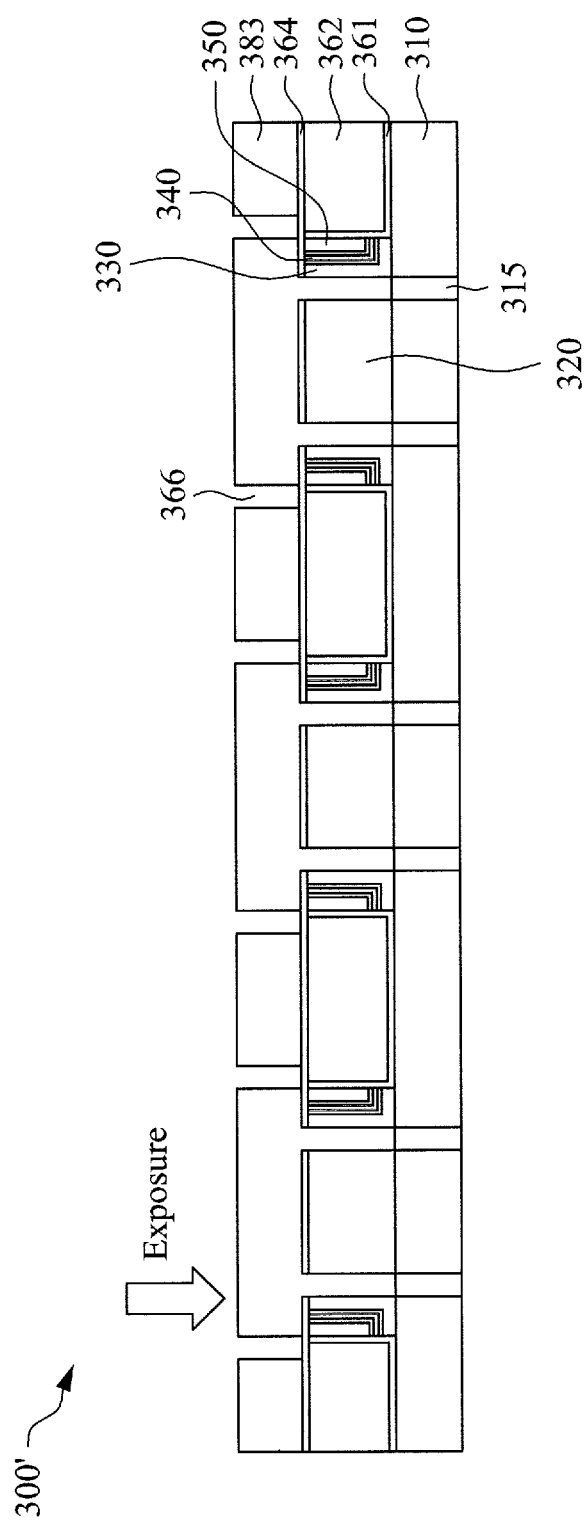

FIG. 3O is a cross-sectional view of the MRAM device 300' in which an exposure process is performed on the photoresist layer 383 to form a pattern of the photoresist layer 383, at one of the various stages of fabrication, according to some embodiments of the present disclosure. As shown in FIG. 3O, the patterned photoresist layer 383 has a profile that covers the IMD stacks 320, the memory cell sandwiches 330, 340, 350, but has some gaps 366 exposing vertical portions of the protective layer 361 and some portions of the additional IMD layer 362. Each of the gaps 366 of the patterned photoresist layer 383 has one side aligning with a sidewall of a corresponding memory cell sandwich, i.e. aligning with a sidewall of the second electrode layer 350 of a corresponding memory cell sandwich.

Figure 3P:
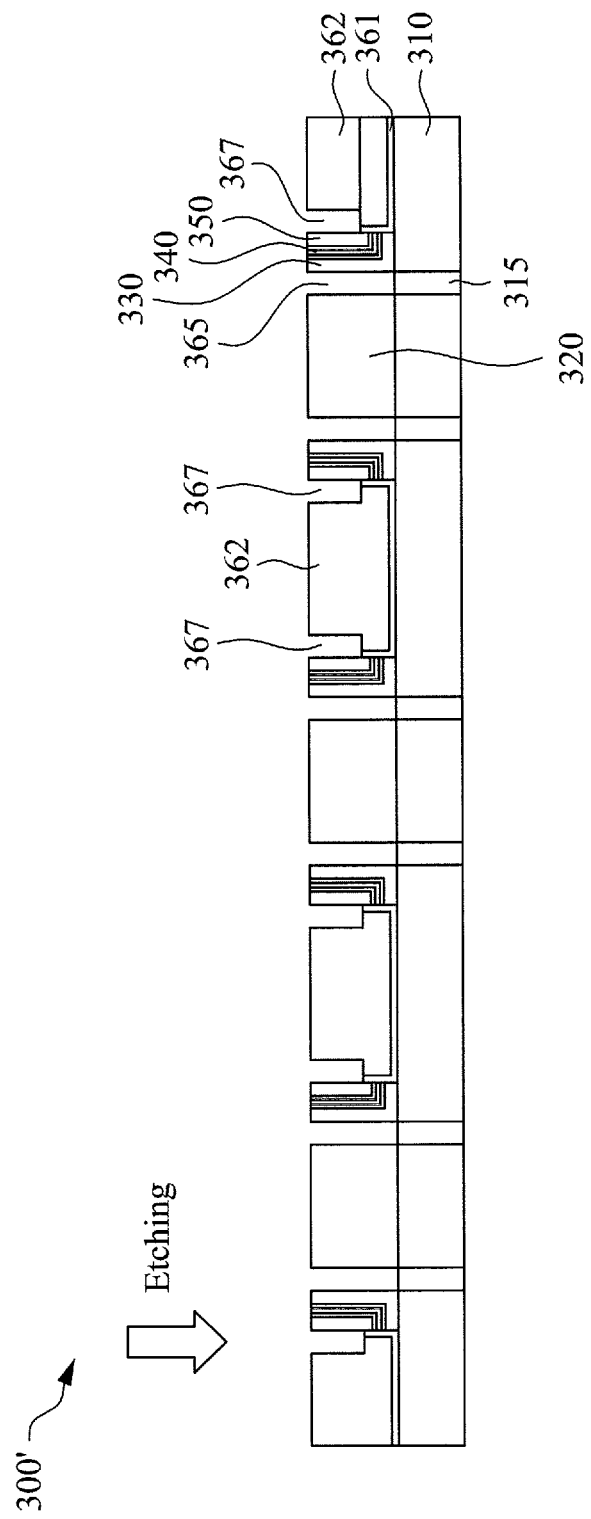

FIG. 3P is a cross-sectional view of the MRAM device 300' in which the protective layer 361 and the additional IMD layer 362 are patterned, at one of the various stages of fabrication, according to some embodiments of the present disclosure. According to some embodiments, the protective layer 361 and the additional IMD layer 362 are patterned to remove their portions beside an adjacent memory cell sandwich, i.e. the portions of the protective layer 361 and the additional IMD layer 362 that are not covered by the photoresist layer 383 as shown in FIG. 3O.

In some embodiments, the patterning process performed on the protective layer 361 and the additional IMD layer 362 may include: based on a profile of the photoresist layer 383 defined by a lithography process, a dry/wet etching process to etch portions of the protective layer 361 and the additional IMD layer 362 that are not covered by the defined profile of the photoresist layer 383, a cleaning process, and a soft/hard baking process to form the patterned protective layer 361 and the patterned IMD layer 362.

As shown in FIG. 3P, the patterned IMD layer 362 includes a plurality of IMD stacks 362 each of which is surrounded by two openings 367. Each opening 367 adjoins a vertical portion of the second electrode layer 350 of a corresponding memory cell sandwich. In one example, the etching process performed on the protective layer 361 and the additional IMD layer 362 can be controlled, e.g. by controlling the etching time, to make each opening 367 have a proper depth such that an adjacent electrode 350 of a memory cell sandwich (which can also be referred to as a memory cell hereinafter) is exposed through the opening 367, but the electrode 330 and the MTJ 340 of the same memory cell are protected by the protective layer 361 and are not exposed through the opening 367. As such, both electrodes 330, 350 of each memory cell have been exposed for electrical connection. In addition, the coating layer 364 has been removed through the in-situ etching at FIG. 3P as well.

Figure 3Q:
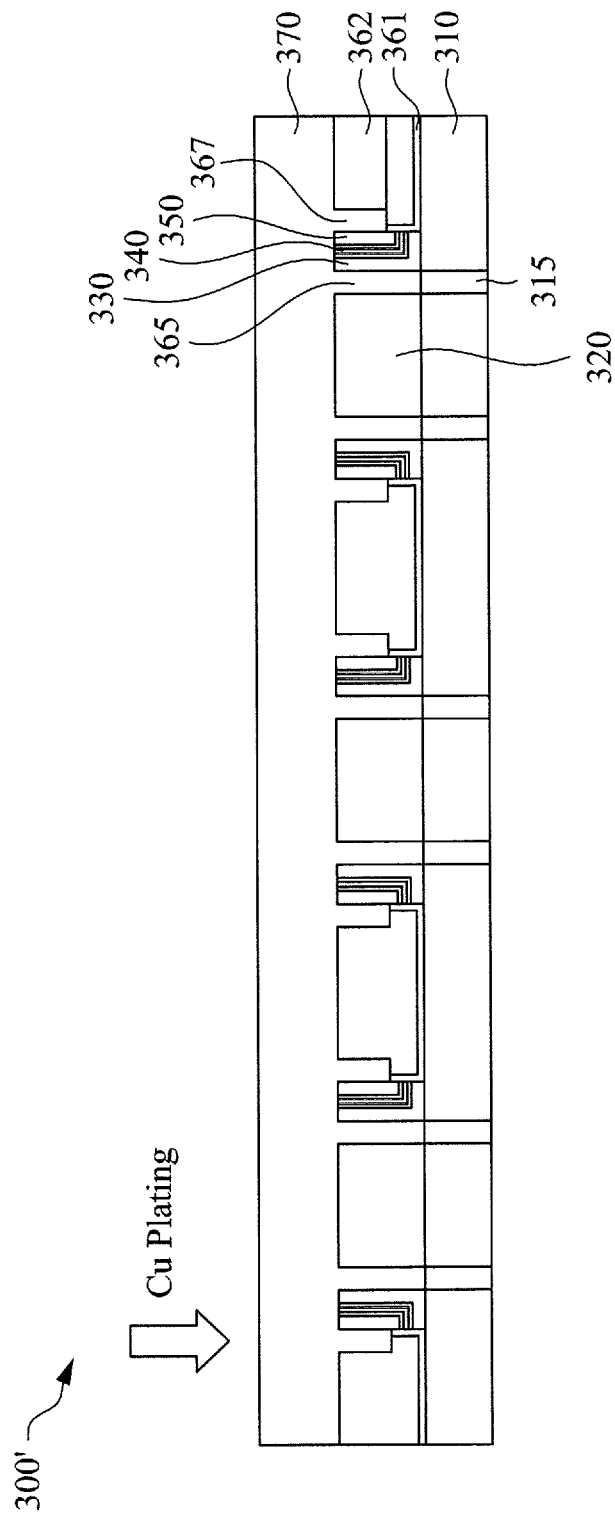
Figure 3R:
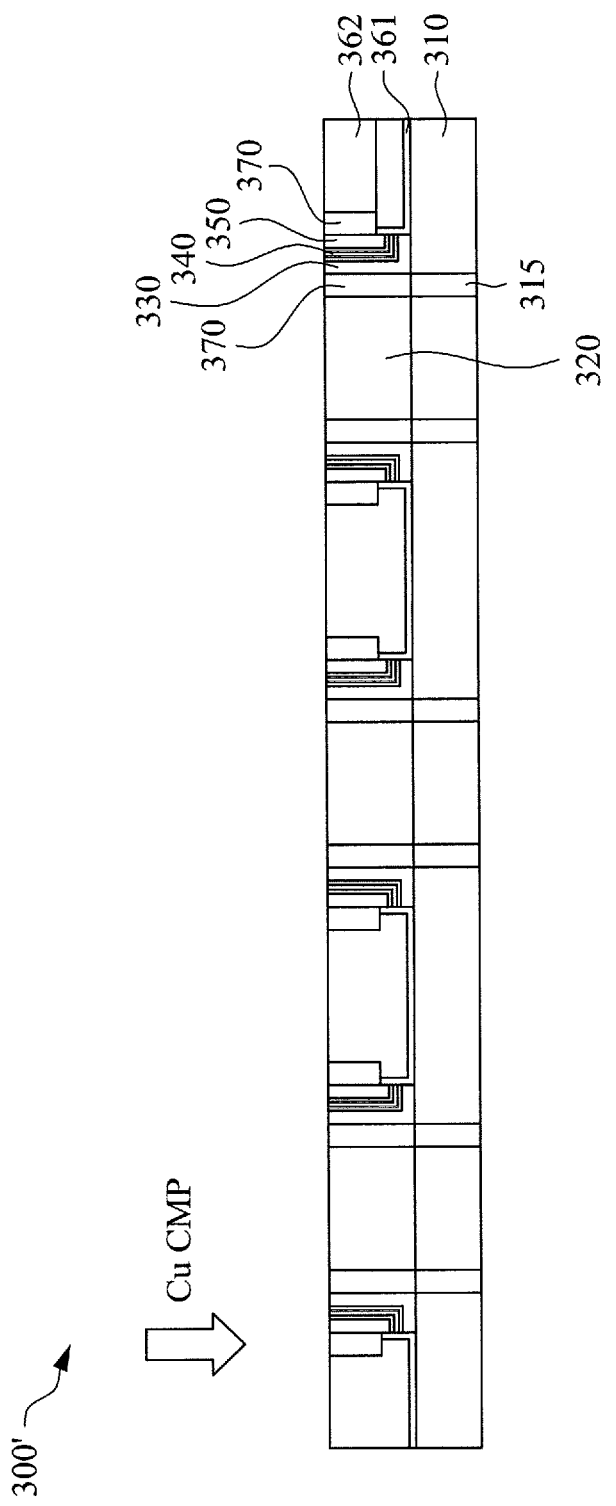

FIG. 3Q is a cross-sectional view of the MRAM device 300' including a conductive layer 370 which is formed over all layers shown in FIG. 3P, at one of the various stages of fabrication, according to some embodiments of the present disclosure. According to some embodiments, the conductive layer 370 may be formed by plating some conductive material, e.g. copper (Cu). As shown in FIG. 3Q, the plated conductive material fills in the openings 365 and 367 such that each electrode 330, 350 of each memory cell has been electrically connected to a conducive material. The conducive material plated into each opening 365 is electrically coupled to the corresponding conductive material 315 under the opening 365.

FIG. 3R is a cross-sectional view of the MRAM device 300' in which the top portion of the conductive layer 370 is removed, at one of the various stages of fabrication, according to some embodiments of the present disclosure. According to some embodiments, the top portion of the conductive layer 370 is removed by a CMP polishing process. After the CMP polishing process, the remaining portions of the conductive layer 370 are respectively filling in the openings 365 and the openings 367, such that there is no top portion of the conductive layer 370 left on any memory cell to electrically connect the remaining portions in the openings 365 and the openings 367.

According to some embodiments, each remaining portion of the conductive layer 370 in each opening 365 and the corresponding conductive material 315 under the opening 365 together form a first conductive line, and each remaining portion of the conductive layer 370 in each opening 367 forms a second conductive line. Each first conductive line extends along a first direction through the backend layer 310 and may electrically connect the electrode 330 of the adjoining memory cell with an electrode of a neighbor memory cell above or under the backend layer 310. Each second conductive line extends along a second direction in parallel with the backend layer 310 and may electrically connect the electrode 350 of the adjoining memory cell with an electrode of a neighbor memory cell on the backend layer 310. In various embodiments, one of the first and second conductive lines is a bit line; and the other one of the first and second conductive lines is a word line.

Figure 4:
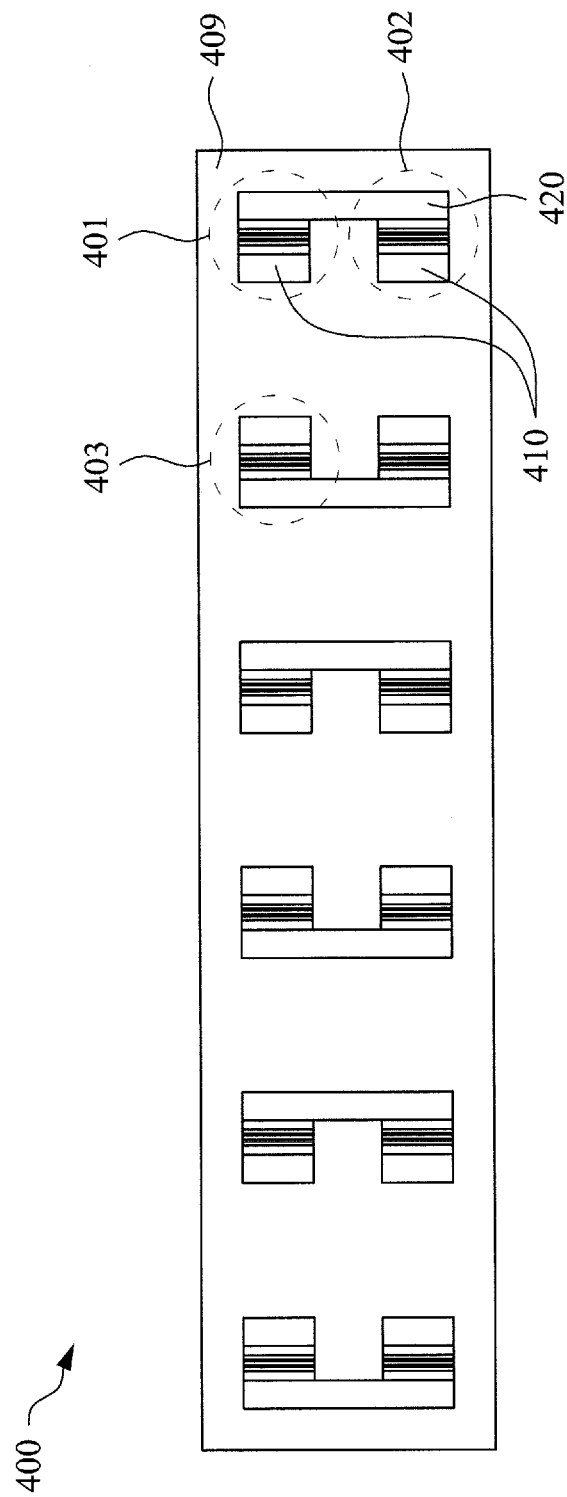
FIG. 4 illustrates a top view of an exemplary memory device, in accordance with some embodiments of the present disclosure.

FIG. 4 illustrates a top view of an exemplary memory device 400, in accordance with some embodiments of the present disclosure. In the illustrated embodiment of FIG. 4, the memory device 400 includes a plurality of memory cells 401, 402 arranged in an array. In one embodiment, each memory cell in FIG. 4 is an MRAM cell having a vertical structure that is fabricated based on a process illustrated in FIGS. 3A-3R.

As shown in FIG. 4, any two adjacent MRAM cells, e.g. the two adjacent MRAM cells 401, 402, that are arranged in a same column is electrically connected with each other by a conductive line 420, which corresponds to the conductive line formed in the opening 367 described with respect to FIGS. 3P-3R. Any MRAM cell in FIG. 4, e.g. the MRAM cell 401 is electrically connected with a neighbor MRAM cell (not shown in FIG. 4) under or above the backend layer by a conductive line 410, which corresponds to the conductive line formed in the opening 365 described with respect to FIGS. 3P-3R. As shown in FIG. 4, any two adjacent MRAM cells, e.g. the two adjacent MRAM cells 401, 403, that are arranged in a same row is isolated from each other by a dielectric material 409. As discussed before with respect to FIG. 2, due to the vertical structure of the MRAM cells in FIG. 4, the MRAM device 400 can have a storage density higher (e.g. by 25%) than that of an MRAM device with a horizontal or lateral structure.

Figure 5:
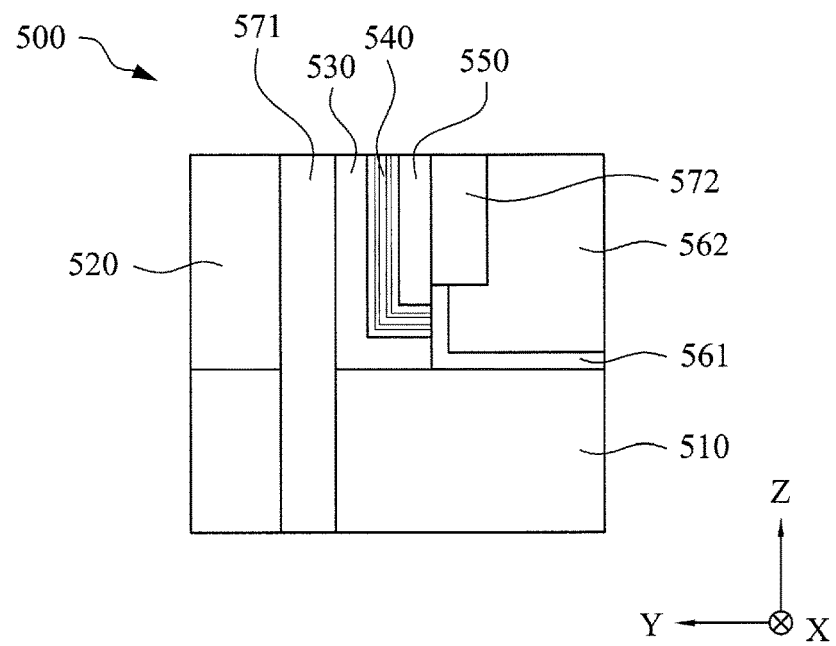
FIG. 5 illustrates a cross-sectional view of an exemplary memory cell, in accordance with some embodiments of the present disclosure.

FIG. 5 illustrates a cross-sectional view of an exemplary memory cell 500, in accordance with some embodiments of the present disclosure. The memory cell 500 may be an MRAM cell that is fabricated based on a process illustrated in FIGS. 3A-3R. As shown in FIG. 5, the memory cell 500 includes a vertical sandwich structure that extends along a direction (direction Z in FIG. 5) perpendicular to an upper surface of a backend IMD layer 510. The vertical sandwich structure includes a first electrode 530, a second electrode 550, and an MTJ 540 sandwiched between the two electrodes. Each of the first electrode 530, the second electrode 550, and the MTJ 540 extends vertically or perpendicular to the upper surface of the backend IMD layer 510. The first electrode 530 is electrically connected to a conductive line 571 that extends along the Z direction through the backend IMD layer 510 and may connect the first electrode 530 to an electrode of another memory cell above or under the backend IMD layer 510. The second electrode 550 is electrically connected to a conductive line 572 that extends along a direction (direction X in FIG. 5) the backend IMD layer 510 and may connect the second electrode 550 to an electrode of another memory cell on the backend IMD layer 510. The memory cell 500 is isolated by a dielectric material 520, 562 from other memory cells arranged along a direction (direction Y in FIG. 5) that is in parallel with the backend IMD layer 510 and perpendicular to the direction X. The protective layer 561 in FIG. 5 can protect the electrodes 530, 550 and the MTJ 540 in the memory cell 500.

Figure 6:
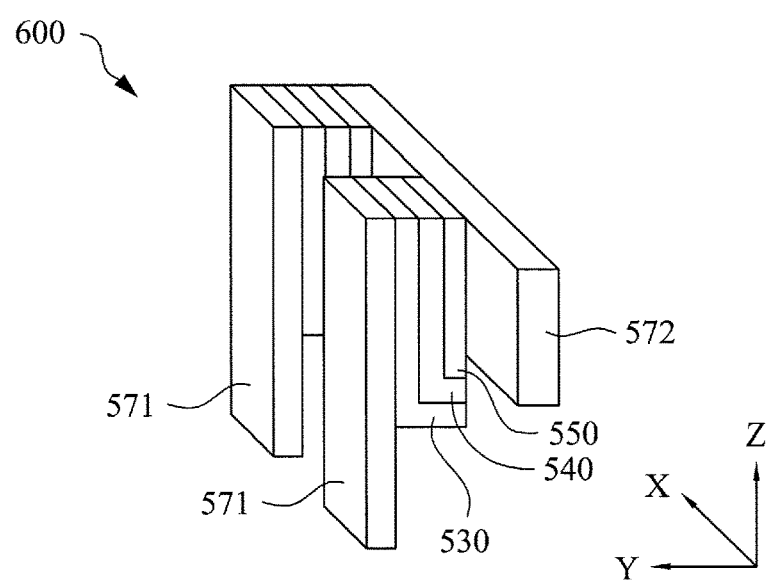
FIG. 6 illustrates exemplary conductive lines electrically connecting multiple memory cells, in accordance with some embodiments of the present disclosure.

FIG. 6 illustrates exemplary conductive lines electrically connecting multiple memory cells, in accordance with some embodiments of the present disclosure. As shown in FIG. 6, two adjacent memory cells are electrically connected by a conductive line 572 extending along the direction X. In one embodiment, each of the two adjacent memory cells may be an MRAM cell that is fabricated based on a process illustrated in FIGS. 3A-3R and has a vertical structure extending along the direction Z as shown in FIG. 5. As shown in FIG. 6, each memory cell is electrically connected by a conductive line 571 extending along the direction Z, where the conductive line 571 may electrically connect the memory cell to a neighbor memory cell (not shown in FIG. 6) arranged along the direction Z.

Figure 7:
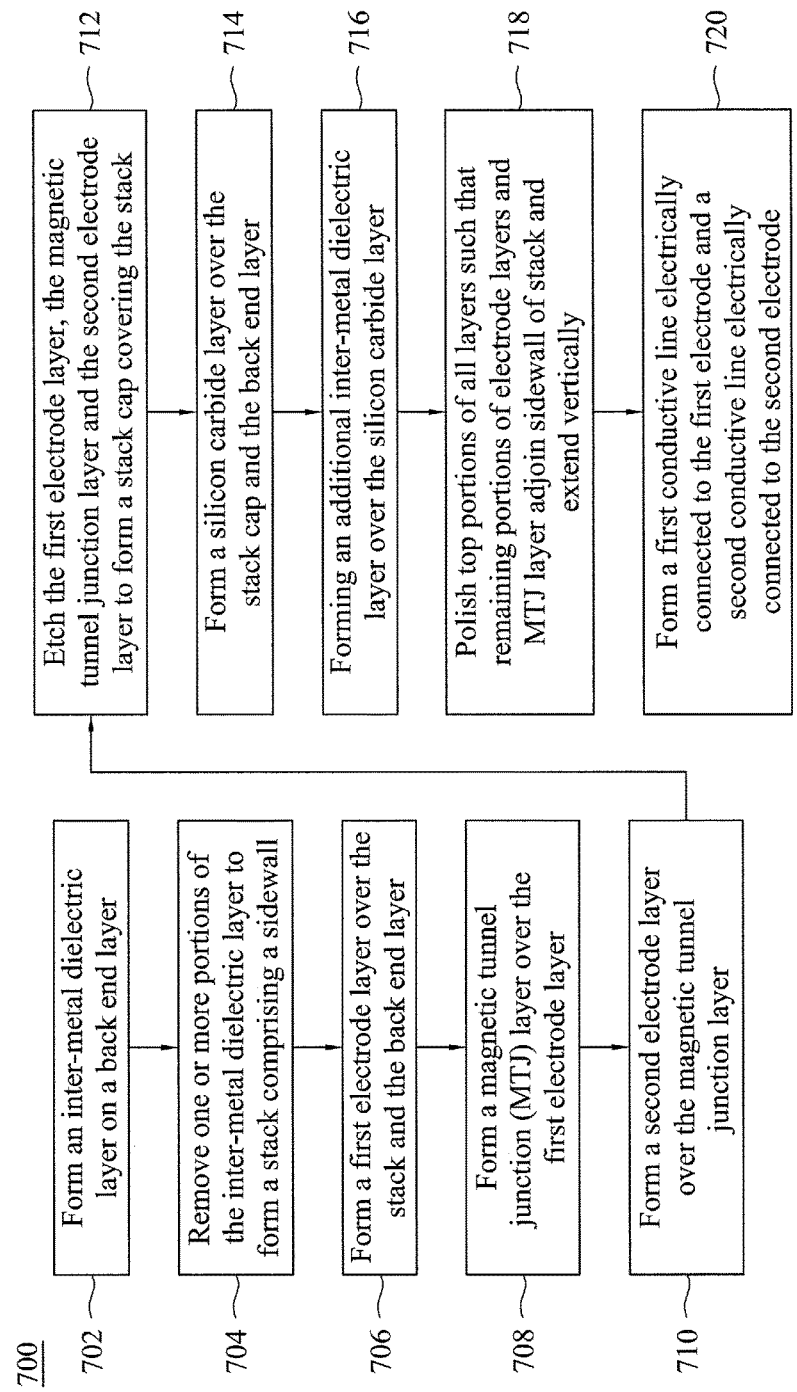
FIG. 7 is a flow chart illustrating an exemplary method for forming a memory cell, in accordance with some embodiments of the present disclosure.

FIG. 7 is a flow chart illustrating an exemplary method 700 for forming a memory cell, in accordance with some embodiments of the present disclosure. At operation 702, an inter-metal dielectric layer is formed on a backend layer. One or more portions of the inter-metal dielectric layer is removed at operation 704 to form a stack comprising a sidewall. A first electrode layer is formed at operation 706 over the stack and the backend layer. A magnetic tunnel junction (MTJ) layer is formed at operation 708 over the first electrode layer. A second electrode layer is formed at operation 710 over the MTJ layer.

The first electrode layer, the magnetic tunnel junction layer and the second electrode layer are etched at operation 712 to form a stack cap covering the stack. A silicon carbide layer is formed at operation 714 over the stack cap and the backend layer. An additional inter-metal dielectric layer is formed at operation 716 over the silicon carbide layer. Top portions of all layers above the backend layer are polished at operation 718 such that the remaining portions of the electrode layers and the MTJ layer adjoin a sidewall of stack and extend vertically or perpendicular to an upper surface of the backend layer. At operation 720, a first conductive line electrically connected to the first electrode and a second conductive line electrically connected to the second electrode are formed. It can be understood that the order of the steps shown in FIG. 7 may be changed according to different embodiments of the present disclosure.

In an embodiment, a memory cell formed on a backend layer over a substrate is disclosed. The memory cell includes: a first electrode, a second electrode and a magnetic tunnel junction. The first electrode has sidewalls and a bottom surface disposed over the backend layer. The second electrode has sidewalls and a bottom surface in contact with the backend layer. The magnetic tunnel junction is formed between the first electrode and the second electrode. The magnetic tunnel junction is coupled to a sidewall of the first electrode and coupled to a sidewall of the second electrode.

In another embodiment, a memory device is disclosed. The memory device includes a backend layer and plurality of memory cells formed on the backend layer. Each of the plurality of memory cells includes: a first electrode, a second electrode and a magnetic tunnel junction. The first electrode has sidewalls and a bottom surface disposed over the backend layer. The second electrode has sidewalls and a bottom surface in contact with the backend layer. The magnetic tunnel junction is formed between the first electrode and the second electrode. The magnetic tunnel junction is coupled to a sidewall of the first electrode and coupled to a sidewall of the second electrode.

In yet another embodiment, a method for forming a memory cell is disclosed. The method includes: forming an inter-metal dielectric layer on a backend layer; removing one or more portions of the inter-metal dielectric layer to form a stack comprising a sidewall; forming a first electrode layer over the stack and the backend layer; forming a magnetic tunnel junction layer over the first electrode layer; forming a second electrode layer over the magnetic tunnel junction layer; and removing portions of the first electrode layer, the magnetic tunnel junction layer and the second electrode layer, wherein the remaining portions of the first electrode layer, the magnetic tunnel junction layer and the second electrode layer adjoin the sidewall of the stack and extend along a direction perpendicular to an upper surface of the backend layer.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell formed on a backend layer over a substrate, comprising:
   a first electrode with sidewalls and a bottom surface disposed over the backend layer;
   a second electrode with sidewalls and a bottom surface in contact with the backend layer;
   a magnetic tunnel junction formed between the first electrode and the second electrode, wherein the magnetic tunnel junction is coupled to a sidewall of the first electrode and coupled to a sidewall of the second electrode; and
   a first conductive line that extends along a first direction over the backend layer and electrically connects the first electrode with an electrode of a first neighbor memory cell on the backend layer.

2. The memory cell of claim 1, wherein:
   the backend layer extends in a second direction; and
   the magnetic tunnel junction extends in a third direction substantially perpendicular to the second direction.

3. The memory cell of claim 1, further comprises:
   a second conductive line that extends along a second direction through the backend layer and electrically connects the second electrode with an electrode of a second neighbor memory cell under the backend layer.

4. The memory cell of claim 3, wherein one of the first and second conductive lines is a bit line; and the other one of the first and second conductive lines is a word line.

5. The memory cell of claim 1, wherein:
a total thickness of the first electrode, the second electrode and the magnetic tunnel junction along a third direction that is in parallel with the backend layer and perpendicular to the first direction is about 1000 Angstroms; and
a maximum value of lengths of the first electrode, the second electrode and the magnetic tunnel junction along the first direction is about 1450 Angstroms.

6. The memory cell of claim 1, wherein a total thickness of the first electrode, the second electrode and the magnetic tunnel junction along a third direction that is in parallel with the backend layer and perpendicular to the first direction is less than a maximum value of lengths of the first electrode, the second electrode and the magnetic tunnel junction along the first direction.

7. The memory cell of claim 3, wherein each of the first and second conductive lines is isolated by a dielectric material from a neighbor memory cell arranged along a third direction that is in parallel with the backend layer and perpendicular to the first direction.

8. A memory device, comprising:
a backend layer over a substrate; and
a plurality of memory cells formed on the backend layer, wherein each of the plurality of memory cells comprises
a first electrode having a sidewall that extends substantially perpendicular to the backend layer disposed over the substrate,
a second electrode having a sidewall that extends substantially perpendicular to the backend layer and
a magnetic tunnel junction formed between the first electrode and the second electrode, wherein the plurality of memory cells forms a square array extending along a first direction perpendicular to the sidewall of the second electrode and along a second direction perpendicular to the first direction, and each of the plurality of memory cells has a first neighbor memory cell along the first direction and a second neighbor memory cell along the second direction.

9. The memory device of claim 8, wherein:
the backend layer extends in a first direction; and
the magnetic tunnel junction extends in a second direction substantially perpendicular to the first direction.

10. The memory device of claim 8, wherein each of the plurality of memory cells further comprises:
a first conductive line that extends along a first direction over the backend layer and electrically connects the first electrode with an electrode of a first neighbor memory cell in the plurality of memory cells; and
a second conductive line that extends along a second direction perpendicular to the backend layer and electrically connects the second electrode with an electrode of a second neighbor memory cell.

11. The memory device of claim 10, further comprising:
an additional backend layer above or under the backend layer; and
an additional plurality of memory cells formed on the additional backend layer, wherein the second neighbor memory cell is one of the additional plurality of memory cells.

12. The memory device of claim 10, wherein one of the first and second conductive lines is a bit line; and the other one of the first and second conductive lines is a word line.

13. The memory device of claim 10, wherein:
a total thickness of the first electrode, the second electrode and the magnetic tunnel junction in each memory cell along a third direction that is in parallel with the backend layer and perpendicular to the first direction is about 1000 Angstroms; and
a maximum value of lengths of the first electrode, the second electrode and the magnetic tunnel junction in each memory cell along the first direction is about 1450 Angstroms.

14. The memory device of claim 10, wherein a total thickness of the first electrode, the second electrode and the magnetic tunnel junction in each memory cell along a third direction that is in parallel with the backend layer and perpendicular to the first direction is less than a maximum value of lengths of the first electrode, the second electrode and the magnetic tunnel junction in each memory cell along the first direction.

15. The memory device of claim 8, wherein:
the magnetic tunnel junction is arranged between the sidewalls of the first electrode and the second electrode.

16. The memory device of claim 8, wherein:
the first neighbor memory cell is arranged about 1050 Angstroms away from the memory cell along the first direction and is isolated by a dielectric material from the memory cell; and
the second neighbor memory cell is arranged about 1700 Angstroms away from the memory cell along the second direction and is isolated by the dielectric material from the memory cell.

17. A memory cell formed on a backend layer over a substrate, comprising:
a first electrode with sidewalls and a bottom surface in contact with the backend layer;
a second electrode with sidewalls and a bottom surface disposed over the backend layer;
a magnetic tunnel junction formed between the first electrode and the second electrode, wherein the magnetic tunnel junction is coupled to a sidewall of the first electrode and coupled to a sidewall of the second electrode; and
a first conductive line that extends along a first direction through the backend layer and electrically connects the first electrode with an electrode of a first neighbor memory cell under the backend layer.

18. The memory cell of claim 17, wherein:
the backend layer extends in a second direction; and
the magnetic tunnel junction extends in a third direction substantially perpendicular to the second direction.

19. The memory cell of claim 17, further comprises:
a second conductive line that extends along a second direction over the backend layer and electrically connects the second electrode with an electrode of a second neighbor memory cell on the backend layer.

20. The memory cell of claim 19, wherein one of the first and second conductive lines is a bit line; and the other one of the first and second conductive lines is a word line.

* * * * *